July 7, 1953 L. E. BARTON 2,644,859
STABILIZED SEMICONDUCTOR AMPLIFIER CIRCUITS
Filed Aug. 5, 1950

INVENTOR
LOY E. BARTON
BY H. L. Newton
ATTORNEY

Patented July 7, 1953

2,644,859

UNITED STATES PATENT OFFICE 2,644,859

STABILIZED SEMICONDUCTOR AMPLIFIER CIRCUITS

Loy E. Barton, Princeton, N. J., assignor to Radio Corporation of America, a corporation of Delaware Application August 5, 1950, Serial No. 177,836

8 Claims. (Cl. 179—171)

Figure 1:
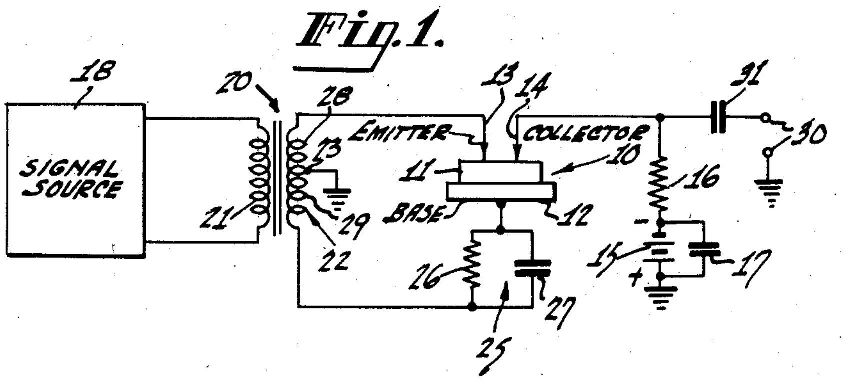

This invention relates generally to signal amplifying systems, and particularly relates to a stabilized amplifier circuit of the semi-conductor type.

Amplifier circuits of the semi-conductor type are well known. Such circuits make use of a semi-conductor device including a semi-conducting body and a base electrode, an emitter electrode and a collector electrode in contact with the body. Devices of this type have become known as transistors. The semi-conducting body may, for example, consist of a silicon or germanium crystal. The base electrode is in low-resistance contact with the crystal and may, for example, consist of a suitable metal soldered to the body, thereby to provide a large-area contact. The emitter and collector electrodes usually are pointed wires in rectifying contact with the body. However, it is feasible to provide emitter and collector electrodes having relatively large-area contact with the body, providing they are in rectifying contact therewith. For operation as a transistor, a potential in the forward direction is impressed between emitter and base, and a potential in the reverse direction is impressed between collector and base. If the crystal is of the N type, the emitter should be positive and the collector negative with respect to the base. If the crystal is of the P type, the potentials must be reversed.

The input signal may be impressed either on the emitter electrode or on the base electrode of a transistor amplifier and in either case the output signal may be derived from the collector electrode. Certain advantages are derived if the input signal is impressed on the base electrode, because the gain is higher than when the signal is impressed on the emitter. However, a transistor amplifier having the input signal impressed on the base has a tendency to oscillate and may, therefore, become unstable. This is due to the fact that, under certain operating conditions, the resistance which appears looking into the base electrode may become negative.

It is, accordingly, an object of the present invention to stabilize a semi-conductor amplifier circuit of the type where the input signal is impressed on the base electrode, thereby to prevent the amplifier circuit from oscillating.

A further object of the invention is to provide a transistor amplifier circuit wherein the negative resistance which appears looking into the base electrode is substantially balanced or counteracted by a positive resistance without substantially decreasing the gain of the circuit.

In accordance with the present invention, an input signal is impressed on a semi-conductor amplifier circuit by means of a signal input transformer. The primary winding of the transformer is connected across the signal source, and two spaced taps on the secondary winding of the transformer are connected to the base and emitter electrodes of the transistor or semi-conductor device. A further tap, intermediate the two spaced taps, is grounded, so that the input signal is applied in push-pull on the base and emitter electrodes of the device. It will be understood that if a signal is applied in phase opposition to emitter and base an unbalanced output signal may be derived from the collector. The spaced taps may be the terminals of the secondary winding. Alternatively, one of the terminals of the secondary winding may be connected to either the emitter or base, while the second tap intermediate the terminals is connected to the other electrode. In that case, a capacitor may be connected across the secondary winding so that the secondary winding is tuned.

The number of turns between the ground connection and the emitter connection is proportioned in such a manner to the number of turns between the ground connection and the base connection that the equivalent positive resistance which appears looking into the emitter will substantially balance or counteract the equivalent negative resistance which appears looking into the base. Accordingly, the neutralizing or loading power consumed by the emitter is utilized as an emitter input voltage, which thus aids to develop further output power. It will, of course, be evident that the input signal applied in push-pull on base and emitter will develop a single-ended output signal from the collector.

Figure 2:
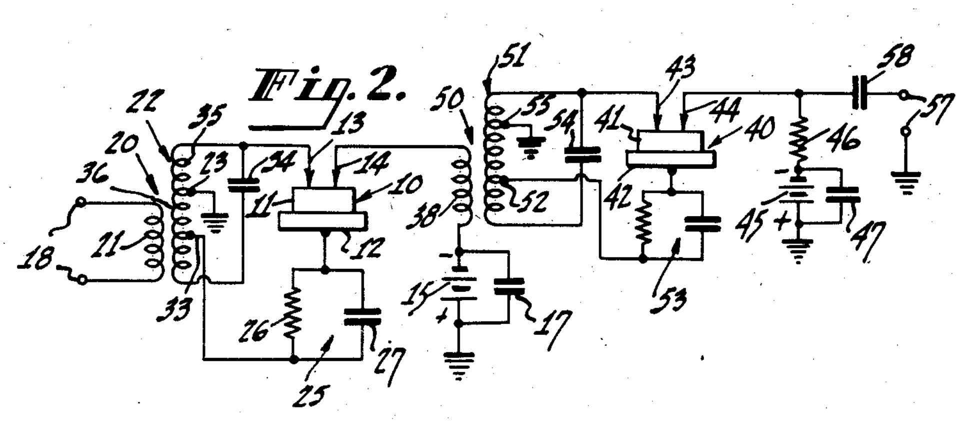

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a semi-conductor amplifier circuit embodying the present invention; and Figure 2 is a schematic circuit diagram of a cascade semi-conductor amplifier system in accordance with the invention.

Referring now to the drawing, in which like components have been designated by the same reference numerals throughout the figures, and particularly to Figure 1, there is illustrated a semi-conductor amplifier circuit comprising a semi-conductor device 10. Device 10 includes a semi-conducting body 11 which may, for example, be a crystal of germanium or silicon, and preferably is of the N type. The upper surface of body 11 may be polished and etched, as is conventional for transistors. Base electrode 12, emitter electrode 13 and collector electrode 14 are in contact with body 11. As explained hereinbefore, base electrode 12 is in low-resistance contact with body 11, while emitter 13 and collector 14 are in rectifying contact therewith.

For the purpose of applying a potential in the reverse direction between collector 14 and base 12, there is provided a source of potential such as battery 15 having its positive terminal grounded, while its negative terminal is connected to collector 14 through load resistor 16. Battery 15 may be bypassed for signal frequency currents by bypass capacitor 17.

In accordance with the present invention, there is provided a balanced or push-pull signal input circuit providing end tap terminals and an intermediate tap terminal. This may be provided by a signal input transformer indicated at 20, having a primary winding 21 and a secondary winding 22. The secondary winding is tapped and provides an impedance element across which the input signals are impressed. Primary winding 21 is connected across signal source 18 which may, for example, be an audio signal or a modulated carrier wave. Since transformer 20 is untuned the input signal preferably is an audio signal. The terminals of secondary winding 22 are connected, respectively, to emitter 13 and base 12. An intermediate tap 23 on secondary winding 22 is grounded as shown.

Bias network 25 is connected serially between base 12 and secondary winding 22. Bias network 25 comprises resistor 26 and capacitor 27 connected in parallel. The purpose of bias network 25 is to develop a suitable potential in the forward direction between emitter 13 and base 12, as is well known. Alternatively, bias network 25 may be replaced by a battery having its positive terminal connected to emitter 13. The portion 28 of secondary winding 22 is provided between the upper terminal of the secondary winding 22 and tap 23, while 29 indicates the portion of secondary winding 22 between tap 23 and the lower terminal of the secondary winding.

An output signal may be developed across load resistor 16 and may be obtained from output terminals 30, one of which is grounded, while the other is coupled to collector 14 through coupling capacitor 31.

The operation of the amplifier circuit of Figure 1 will now be obvious. The input signal developed by source 18 is impressed in push-pull on emitter 13 and base 12. Accordingly, the negative resistance which appears looking into the base electrode 12 may be compensated or balanced by the equivalent positive resistance which appears looking into emitter 13. Thus, assuming, for example, that the equivalent negative base resistance is about 10,000 ohms, while the equivalent positive emitter resistance is about 500 ohms, the turns ratio of portion 28 of secondary winding 22 compared to that of portion 29 should be approximately 1 to 4.5. In other words, the number of turns of portion 29 connected to base 12 should be 4.5 times as large as the number of turns of portion 48 connected to emitter 13.

Under these conditions, the equivalent negative base resistance will be substantially balanced by the equivalent positive emitter resistance. Furthermore, the portion of the input signal impressed on emitter 13 will increase the output signal derived from collector 14. Consequently, the loading power consumed by emitter 13 is utilized for producing an additional output power.

A cascade-connected amplifier circuit in accordance with the present invention is illustrated in Figure 2. The first amplifier stage includes semi-conductor device 10. The input signal is impressed on input terminals 18 connected to primary winding 21 of signal input transformer 20. The input transformer 20 has a secondary winding 22, of which one terminal is connected to emitter 13. A tap 33 on winding 22 is connected to base 12 through bias network 25. Tuning capacitor 34 is connected across secondary winding 22. Since signal input transformer is tuned the signal impressed on input terminals 18 preferably is a modulated carrier wave such, for example, as the intermediate-frequency wave of a superheterodyne receiver.

Tap 23, which is intermediate tap 33 and the upper terminal of winding 22, is grounded. Portion 35 of secondary winding 22 indicates the portion between the upper terminal and tap 23. Portion 36 indicates the portion between taps 23 and 33. Secondary winding 22 contains more turns than portions 35 and 36 to provide a high impedance so that the capacitance of tuning capacitor 34 may be made small. The turns ratio of portions 35 and 36 is again determined in the manner previously outlined, and should be 1:4.5 under the above assumptions. The output signal may be developed across output coil 38, connected between battery 15 and collector 14.

The second amplifier stage is similar to the first stage and includes a semi-conductor device 40 having a semi-conducting body 41, base electrode 42, emitter electrode 43 and collector electrode 44. Battery 45 has its positive terminal grounded, while its negative terminal is connected to collector 44 through load resistor 46. Battery 45 may be bypassed for signal frequency currents by bypass capacitor 47.

Output coil 38 is the primary winding of transformer 50, having a secondary winding 51 the upper terminal of which is connected to emitter 43. Tap 52 on secondary winding 51 is connected to base 42 through bias network 53. Tuning capacitor 54 is connected across secondary winding 51. Tap 55, which is intermediate the upper terminal of secondary winding 51 and tap 52, is grounded as shown. The output signal may be derived from output terminals 57, one of which is grounded while the other is coupled to collector 44 through coupling capacitor 58.

It will be understood that the two amplifier stages of the amplifier system of Figure 2 operate in the same manner. By way of example, if tuning capacitor 54 has a capacitance of 220 micromicrofarads, and if resonant circuit 51, 54 has a Q of 100 at 455 kilocycles, the total number of turns of secondary winding 51 may amount to 69. The number of turns of primary winding 38 may be 23. The number of turns of secondary winding 51, between taps 52 and 55, may also amount to 23, so that the number of turns between tap 55 and the upper terminal of secondary winding 51 should be 5. This will again give the same turns ratio of 1:4.5 between the portions of secondary winding 51 connected to emitter 43 and base 42. The total number of turns of secondary winding 51 and the capacitance of tuning capacitor 54 determine the selectivity of the resonant circuit 51, 54. It will be understood that transformer 20 may be designed in the same manner as transformer 50.

There has thus been described a semi-conductor amplifier circuit which is stabilized against undesirable oscillations. The input signal is impressed in push-pull on the base and emitter electrodes of the semi-conductor device, while a single-ended output signal is obtained from the collector electrode. In this manner, the equivalent negative base resistance may be counteracted or substantially balanced by the equivalent positive emitter resistance without substantially reducing the gain of the circuit.

What is claimed is:

1. An amplifier system comprising a semi-conductor device including a semi-conducting body, a base electrode, an emitter electrode and a collector electrode in contact with said body, means for applying operating potentials to said electrodes, a signal input circuit providing an impedance element across which signals are impressed, two spaced taps on said impedance element being connected respectively to said base electrode and to said emitter electrode, a further tap intermediate said spaced taps on said impedance element being connected to a point of substantially fixed potential, thereby to impress said signals in push-pull on said base and emitter electrodes, and an output circuit coupled between said collector electrode and said point of substantially fixed potential, the impedance between said spaced taps and said further tap on said impedance element being so proportioned that the equivalent negative resistance which appears looking into said base electrode is counteracted by the equivalent positive resistance which appears looking into said emitter electrode.

2. An amplifier system comprising a semi-conductor device including a semi-conducting body, a base electrode, an emitter electrode and a collector electrode in contact with said body, means for applying operating potentials to said electrodes, a source of signals, a signal input transformer having a primary and a secondary winding, said primary winding being connected across said source, the terminals of said secondary winding being connected respectively to said emitter electrode and to said base electrode, means connecting an intermediate tap on said secondary winding to a point of substantially fixed potential, thereby to impress said signals in push-pull on said emitter and base electrodes, and an output circuit connected between said point of substantially fixed potential and said collector electrode, said intermediate tap being positioned on said secondary winding so as to balance substantially the equivalent negative resistance which appears looking into said base electrode by the equivalent positive resistance which appears looking into said emitter electrode.

3. An amplifier system comprising a semi-conductor device including a semi-conducting body, a base electrode, an emitter electrode and a collector electrode in contact with said body, means for applying a potential in the forward direction between said emitter and base electrodes and for applying a potential in the reverse direction between said collector electrodes, a source of signals, a signal input transformer having a primary and a secondary winding, said primary winding being connected across said source, the terminals of said secondary winding being connected respectively to said emitter electrode and to said base electrode, means connecting an intermediate tap on said secondary winding to a point of substantially fixed potential, thereby to impress said signals in push-pull on said emitter and base electrodes, and an output circuit including a load impedance element connected between said point of substantially fixed potential and said collector electrode, said intermediate tap being positioned on said secondary winding so as to balance substantially the equivalent negative resistance which appears looking into said base electrode by the equivalent positive resistance which appears looking into said emitter electrode.

4. An amplifier system comprising a semi-conductor device including a semi-conducting body, a base electrode, an emitter electrode and a collector electrode in contact with said body, means for applying operating potentials to said electrodes, a source of signals, a signal input transformer having a primary and a secondary winding, said primary winding being connected across said source, two spaced taps on said secondary winding being connected respectively to said base electrode and to said emitter electrode, a further tap intermediate said spaced taps on said secondary winding being connected to a point of substantially fixed potential, thereby to impress said signals in push-pull on said base and emitter electrodes, a capacitor connected across said secondary winding, and an output circuit including an impedance element connected between said collector electrode and said point of substantially fixed potential, the number of turns between said spaced taps and said further tap on said secondary winding being so proportioned that the equivalent negative resistance which appears looking into said base electrode is balanced substantially by the equivalent positive resistance which appears looking into said emitter electrode.

5. An amplifier system comprising a semi-conductor device including a semi-conducting body, a base electrode, an emitter electrode and a collector electrode in contact with said body, means for applying operating potentials to said electrodes, a source of signals, a signal input transformer having a primary and a secondary winding, said primary winding being connected across said source, one terminal and a first tap on said secondary winding spaced from said one terminal being connected respectively to said base electrode and to said emitter electrode, a second tap intermediate said one terminal and said first tap on said secondary winding being connected to a point of substantially fixed potential, thereby to impress said signals in push-pull on said base and emitter electrodes, a capacitor connected between the terminals of said secondary winding, and an output circuit coupled between said collector electrode and said point of substantially fixed potential, the number of turns between said one terminal and said taps on said secondary winding being so proportioned that the equivalent negative resistance which appears looking into said base electrode is counteracted by the equivalent positive resistance which appears looking into said emitter electrode.

6. An amplifier system comprising a semi-conductor device including a semi-conducting body, a base electrode, an emitter electrode and a collector electrode in contact with said body, means for applying a potential in the forward direction between said emitter and collector electrodes and for applying a potential in the reverse direction between said collector and base electrodes, a source of signals, a signal input transformer having a primary and a secondary winding, said primary winding being connected across said source, two spaced taps on said secondary winding being connected respectively to said base electrode and to said emitter electrode, a further tap intermediate said spaced taps on said secondary winding being connected to a point of substantially fixed potential, thereby to impress said signals in push-pull on said base and emitter electrodes, a capacitor connected across said secondary winding, and an output circuit including an impedance element connected between said collector electrode and said point of substantially fixed potential, the number of turns between said spaced taps and said further tap on said secondary winding being so proportioned that the equivalent negative resistance which appears looking into said base electrode is counteracted by the equivalent positive resistance which appears looking into said emitter electrode.

7. A cascade amplifier system comprising a first and a second semi-conductor device, said first device including a first semi-conducting body, a first base electrode, a first emitter electrode and a first collector electrode in contact with said first body, said second device including a second semi-conducting body, a second base electrode, a second emitter electrode and a second collector electrode in contact with said second body, means for applying operating potentials to said electrodes, a source of signals, a first signal input transformer having a first primary and a first secondary winding, said first primary winding being connected across said source, two spaced taps on said first secondary winding being connected respectively to said first base electrode and to said first emitter electrode, means connecting a further tap intermediate said spaced taps on said first secondary winding to a point of substantially fixed potential, a first capacitor connected across said first secondary winding, a second signal transformer having a second primary and a second secondary winding, said second primary winding being connected between said point and said first collector electrode, two spaced taps on said second secondary winding being connected respectively to said second emitter electrode and to said second base electrode, means connecting a further tap intermediate said spaced taps on said second secondary winding to said point, a second capacitor connected across said second secondary winding, and an output circuit connected between said point and said second collector electrode, said taps on said first and second secondary windings being positioned so as to balance the equivalent negative resistance which appears looking into said base electrodes by the positive resistance which appears looking into the associated emitter electrode.

8. A cascade amplifier system comprising a first and a second semi-conductor device, said first device including a first semi-conducting body, a first base electrode, a first emitter electrode and a first collector electrode in contact with said first body, said second device including a second semi-conducting body, a second base electrode, a second emitter electrode and a second collector electrode in contact with said second body, means for applying a potential in the forward direction between each emitter electrode and its associated base electrode and for applying a potential in the reverse direction between each collector electrode and its associated base electrode, a source of signals, a first signal input transformer having a first primary and a first secondary winding, said first primary winding being connected across said source, one terminal and a first tap spaced therefrom on said first secondary winding being connected respectively to said first base electrode and to said first emitter electrode, means connecting a further tap intermediate said one terminal and said first tap on said first secondary winding to a point of substantially fixed potential, a first capacitor connected between the terminals of said first secondary winding, a second signal transformer having a second primary and a second secondary winding, said second primary winding being connected between said point and said first collector electrode, one terminal and a first tap being spaced therefrom on said second secondary winding being connected respectively to said second emitter electrode and to said second base electrode, means connecting a further tap intermediate said one terminal and said first tap on said second secondary winding to said point, a second capacitor connected between the terminals of said second secondary winding, and an output circuit connected between said point and said second collector electrode, said taps on said first and second secondary windings being positioned so as to balance the equivalent negative resistance which appears looking into one of said base electrodes by the positive resistance which appears looking into the associated emitter electrode.

LOY E. BARTON.

References Cited in the file of this patent

UNITED STATES PATENTS

| Number | Name | Date |
|---|---|---|
| 1,722,089 | Heising | July 23, 1929 |
| 1,868,162 | Elliott | July 19, 1932 |
| 1,884,675 | Heising | Oct. 25, 1932 |
| 1,905,826 | Elliott | Apr. 25, 1933 |
| 1,968,104 | Roberts | July 31, 1934 |
| 2,517,960 | Barney et al. | Aug. 8, 1950 |
| 2,541,322 | Barney | Feb. 13, 1951 |